United States Patent
Zhang et al.

(10) Patent No.: US 11,265,015 B2
(45) Date of Patent: Mar. 1, 2022

(54) OUT-OF-ORDER PROCESSING FOR BIT-FLIPPING DECODERS IN NON-VOLATILE MEMORY DEVICES

(71) Applicant: SK hynix Inc., Icheon-si (KR)

(72) Inventors: Fan Zhang, Fremont, CA (US); Aman Bhatia, Los Gatos, CA (US)

(73) Assignee: SK hynix Inc., Icheon-si (KR)

( * ) Notice: Subject to any disclaimer, the term of this patent is extended or adjusted under 35 U.S.C. 154(b) by 22 days.

(21) Appl. No.: 16/874,999

(22) Filed: May 15, 2020

(65) Prior Publication Data

US 2021/0359705 A1  Nov. 18, 2021

(51) Int. Cl.
*H03M 13/00* (2006.01)
*H03M 13/11* (2006.01)
*H03M 13/15* (2006.01)

(52) U.S. Cl.
CPC ........ *H03M 13/116* (2013.01); *H03M 13/114* (2013.01); *H03M 13/1108* (2013.01); *H03M 13/159* (2013.01)

(58) Field of Classification Search
CPC .......... H03M 13/116; H03M 13/1108; H03M 13/114; H03M 13/159
See application file for complete search history.

(56) References Cited

U.S. PATENT DOCUMENTS

| | | | | |
|---|---|---|---|---|
| 8,234,555 B2 * | 7/2012 | Yokokawa | ......... | H03M 13/1185 714/786 |
| 8,291,283 B1 * | 10/2012 | Rad | .................... | H03M 13/1137 714/752 |
| 8,291,298 B2 * | 10/2012 | Lo | ..................... | H03M 13/6597 714/774 |
| 8,392,795 B2 * | 3/2013 | Ueng | .................. | H03M 13/114 714/758 |
| 8,595,589 B2 * | 11/2013 | Yedidia | ................ | H03M 13/116 714/758 |
| 8,677,225 B1 * | 3/2014 | Weiner | ................ | G06F 11/1012 714/800 |
| 9,614,547 B2 * | 4/2017 | Fainzilber | ........... | G06F 11/1012 |
| 9,785,502 B2 * | 10/2017 | Zamir | ................ | H03M 13/1102 |
| 10,116,333 B2 * | 10/2018 | Zamir | .................. | H03M 13/116 |
| 10,128,869 B2 * | 11/2018 | Tate | .................... | H03M 13/1111 |
| 10,484,008 B2 | 11/2019 | Zhang et al. | | |
| 11,108,410 B1 * | 8/2021 | Walke | .................. | H03M 13/118 |

(Continued)

*Primary Examiner* — Esaw T Abraham
(74) *Attorney, Agent, or Firm* — Perkins Coie LLP (57) ABSTRACT

Devices, systems and methods for improving the convergence of a bit-flipping decoder in a non-volatile memory are described. An example method includes receiving a noisy codeword that is based on a transmitted codeword generated from an irregular QC-LDPC code, the irregular QC-LDPC code having an associated parity matrix comprising a plurality of columns of circulant matrices, computing a plurality of flipping energies for each column of a first subset of columns from the plurality of columns of circulant matrices, computing, based on the plurality of flipping energies, one or more metrics, selecting, based on the one or more metrics, a second subset of columns from the first subset of columns in an order that is different from a sequential indexing order of the second subset of columns, determining, based on processing the second subset of columns using a vertically shuffled scheduling operation, a candidate version of the transmitted codeword.

20 Claims, 9 Drawing Sheets

(56) References Cited

U.S. PATENT DOCUMENTS

2003/0033570 A1\* 2/2003 Khannanov ........ H03M 13/1102
714/755
2015/0349807 A1\* 12/2015 Vernon ............. H03M 13/6577
714/774
2016/0020783 A1 1/2016 Yang et al.

\* cited by examiner

OUT-OF-ORDER PROCESSING FOR BIT-FLIPPING DECODERS IN NON-VOLATILE MEMORY DEVICES

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, multi-level NAND flash devices can be inherently unreliable and generally need to use ECCs to allow dramatic increase in data reliability at the expense of extra storage space for ECC parity bits. There is a demand for more efficient decoding approaches that can provide data protection with improved convergence properties.

SUMMARY

Embodiments of the disclosed technology relate to improving the convergence of a bit-flipping decoder in a non-volatile memory. This and other features and benefits are achieved at least in-part by processing the circulant-columns in a low-density parity-check (LDPC) code in an out-of-order manner that is based on the flipping energies of the circulant-columns.

In an example aspect, a method for maintaining consistent write latencies in non-volatile memory devices is described. The method includes receiving a noisy codeword that is based on a transmitted codeword generated from an irregular quasi-cyclic low-density parity-check (QC-LDPC) code, the irregular QC-LDPC code having an associated parity matrix comprising a plurality of columns of circulant matrices, computing a plurality of flipping energies for each column of a first subset of columns from the plurality of columns of circulant matrices, computing, based on the plurality of flipping energies, one or more metrics, selecting, based on the one or more metrics, a second subset of columns from the first subset of columns in an order that is different from a sequential indexing order of the second subset of columns, determining, based on processing the second subset of columns using a vertically shuffled scheduling (VSS) operation, a candidate version of the transmitted codeword, wherein the processing comprises performing a message passing algorithm between a plurality of variable nodes and a plurality of check nodes that represent the parity matrix of the irregular QC-LDPC code, and the VSS operation processes each of the variable nodes one by one in each iteration of the message passing algorithm.

In yet another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Solid state drives (SSDs) are a new generation of storage device used in computers. SSDs replace traditional mechanical hard disks by using flash-based memory, which is significantly faster. SSDs speed up computers significantly due to their low read-access times and fast throughputs. SSDs can be configured to use irregular quasi-cyclic LDPC (QC-LDPC) codes to correct any bit-errors in pages read from NAND media. QC-LDPC codes are used to ensure data integrity in storage systems that use the new generation of NAND flash memories. Iterative decoders for LDPC code in general, and irregular QC-LDPC codes in particular, have wide range of complexities. The two primary types of decoders are the low-complexity bit-flipping (BF) decoder with low error-correction capability and the high-complexity min-sum (MS) decoder with high error-correction capability.

For typical SSD applications, most page reads (more than 99%) are by the bit-flipping decoder. Thus, designing hardware for fast and efficient bit-flipping (BF) decoder, which exhibits improved convergence properties, is critical especially in mobile and client SSD applications because of their strict power constraints and throughput requirements.

This document first overviews an example of a non-volatile memory system in which bit-flipping decoder can be implemented to decode irregular QC-LDPC codes, and then describes methods, systems and devices to improve the convergence of the bit-flipping decoder by, for example, processing the circulant-columns in the irregular QC-LDPC code in an out-of-order manner that is based on the flipping energies of the circulant-columns.

FIGS. 1-6 overview a non-volatile memory system (e.g., flash-based memory or NAND flash) in which embodiments of the disclosed technology may be implemented.

Figure 1:
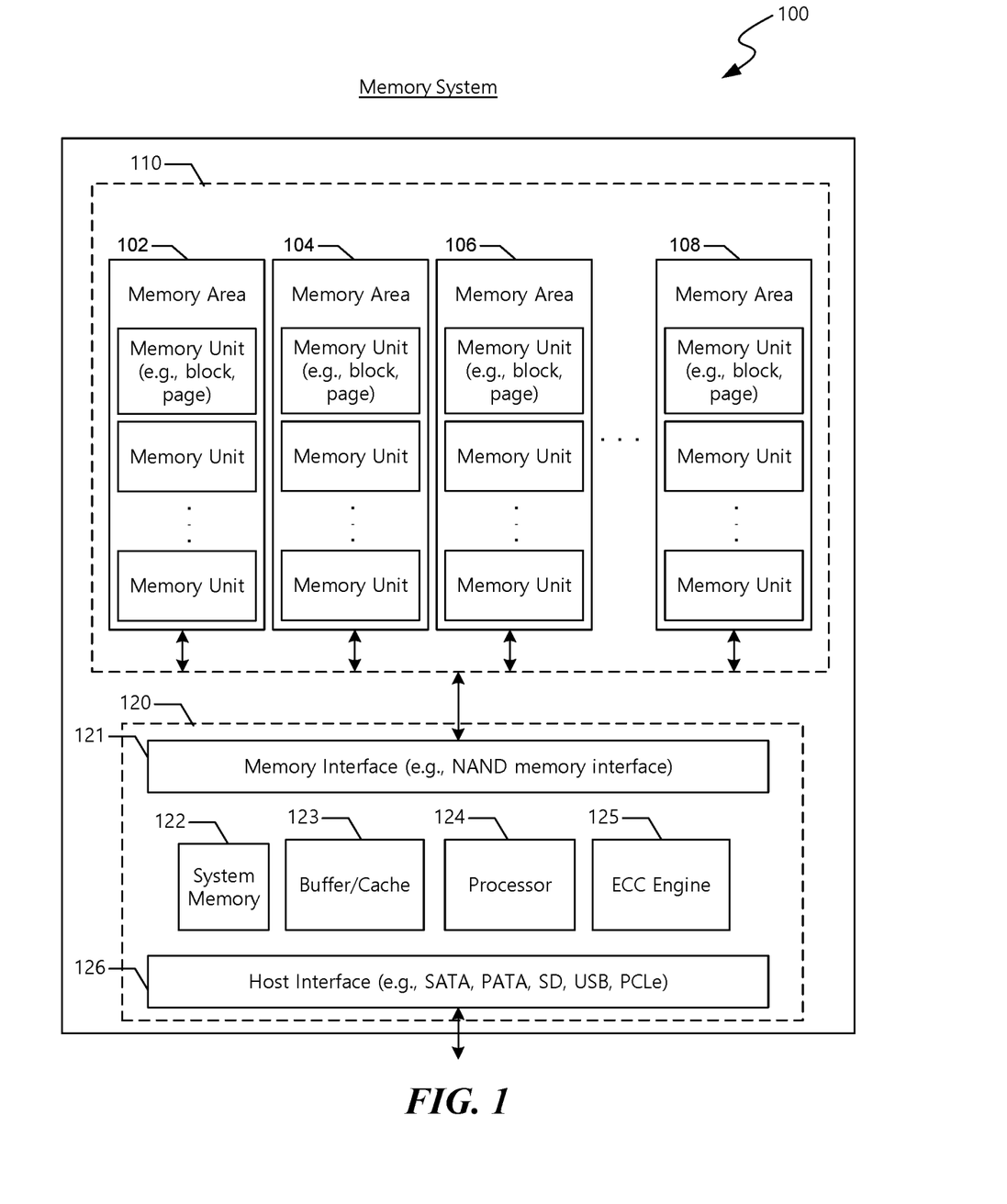
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106 and 108 can be configured to store at least one bit of information (e.g., one bit of information or multiple bits of information), and each of the memory cells in memory area 102, 104, 106 and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
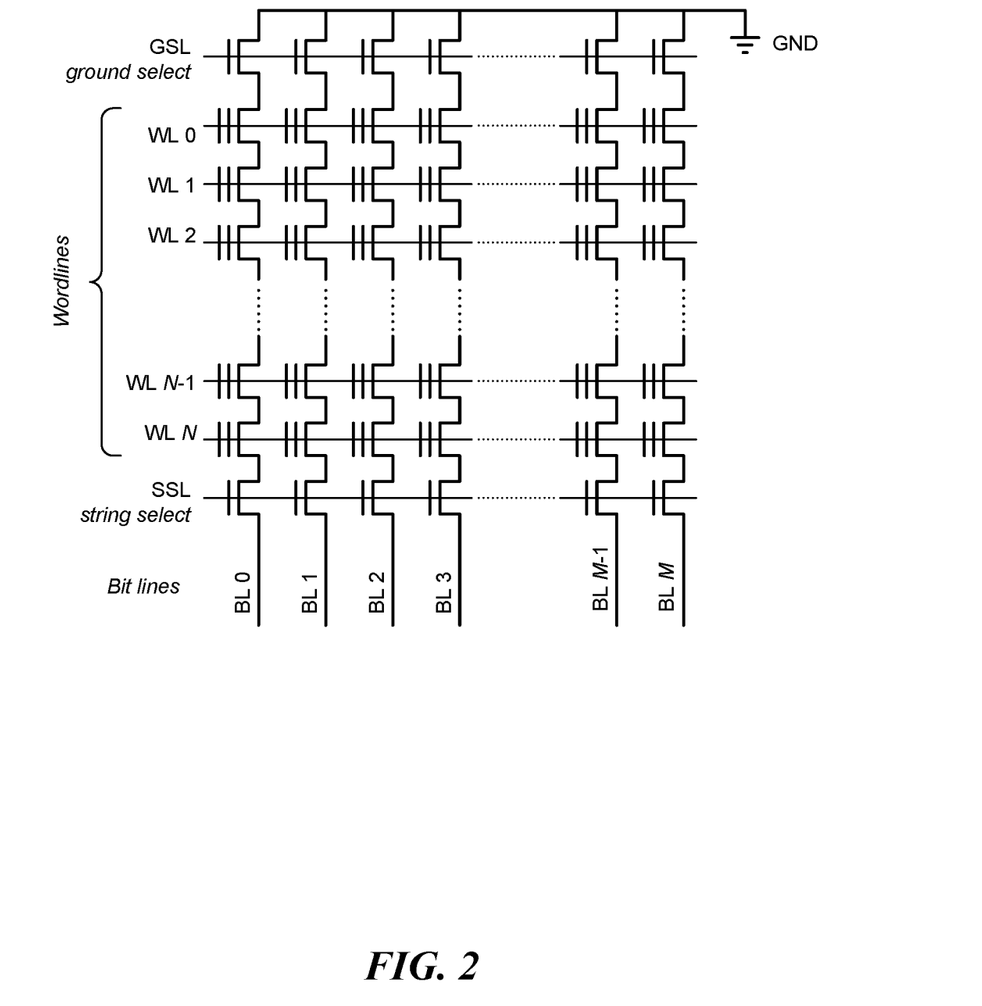
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
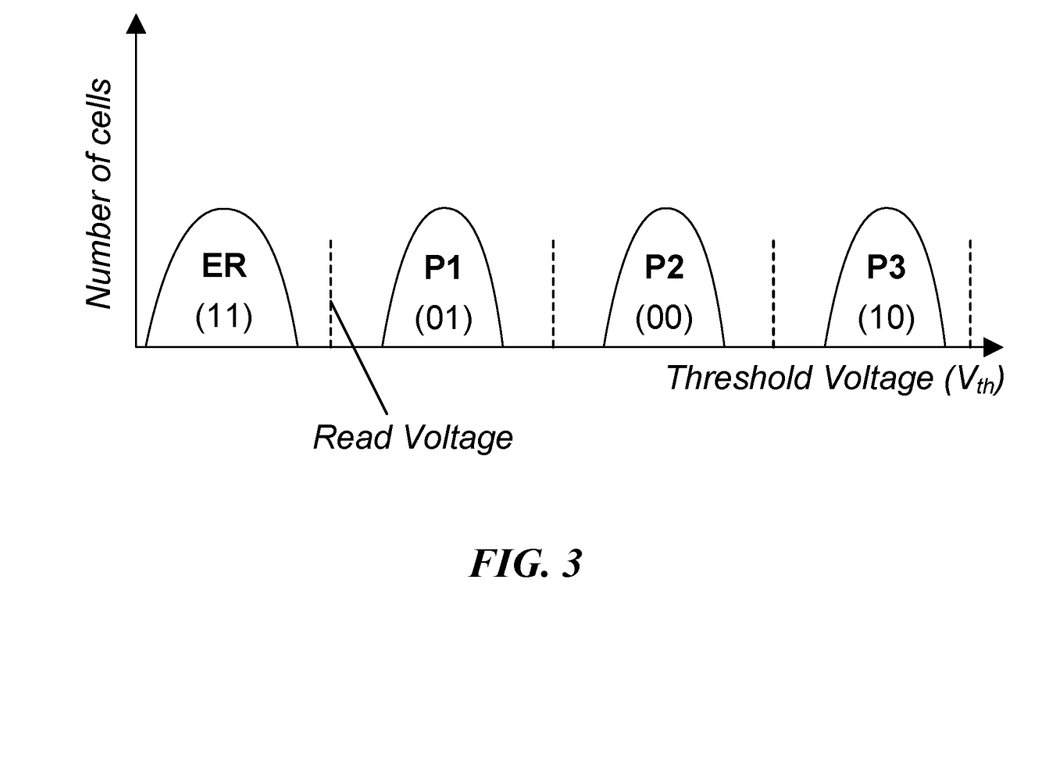
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
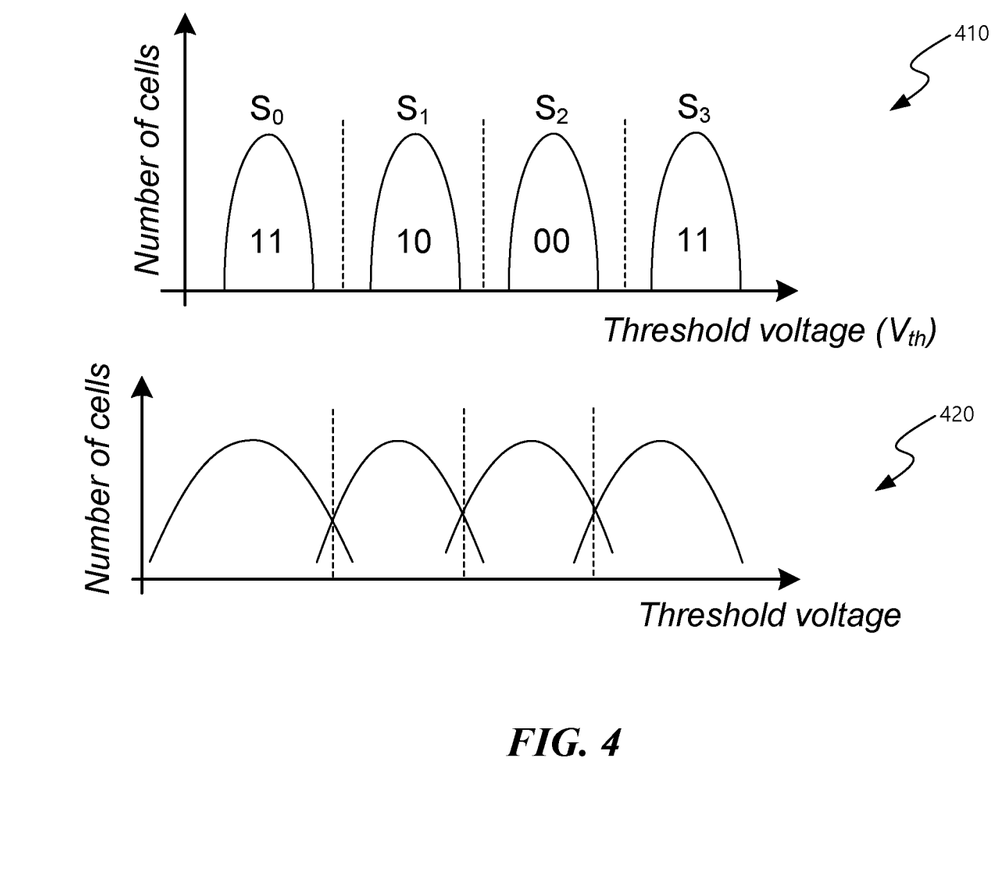
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
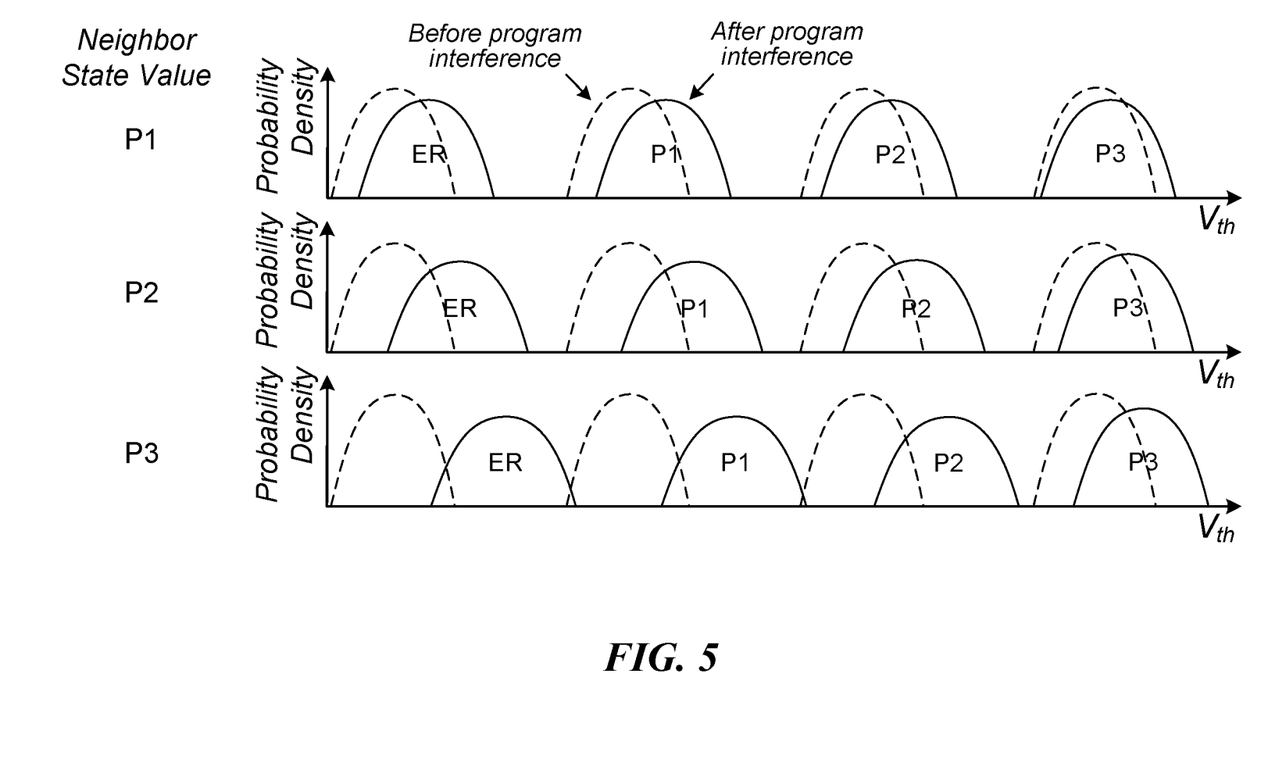
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
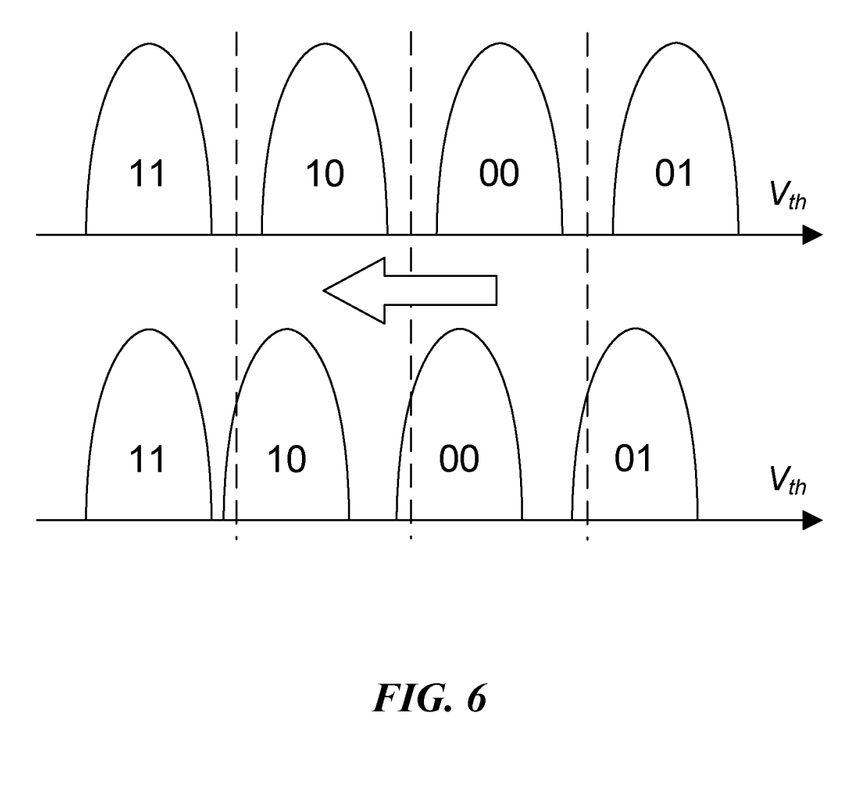
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

According to some embodiments of the disclosed technology, methods, systems and devices improve the convergence of bit-flipping decoder implementations for QC-LDPC codes, which are used in non-volatile memory devices (e.g., as described in FIGS. 1-6) that constitute SSDs. In an example, the convergence is improved by processing the circulant-columns in a QC-LDPC code in an out-of-order manner that is based on one or more functions of the flipping energies of the circulant-columns.

Quasi-cyclic codes are defined by the property that, for an integer $n_0$, every cyclic shift of a codeword by $n_0$ places is also a codeword. For a systematic ($n=mn_0$, $k=mk_0$) quasi-cyclic linear code, the corresponding parity check matrix H is represented as:

$$H = \begin{bmatrix} & & C'_{1,1} & C'_{1,2} & \cdots & C'_{1,k_0} \\ & & C'_{2,1} & C'_{2,2} & \cdots & C'_{2,k_0} \\ I_{n-k} & & C'_{3,1} & C'_{3,2} & & C'_{3,k_0} \\ & & \vdots & \vdots & & \vdots \\ & & C'_{n_0-k_0,1} & C'_{n_0-k_0,2} & \cdots & C'_{n_0-k_0,k_0} \end{bmatrix}$$

Herein, n denotes the length of the code, k denotes the rank of the code (which corresponds to the number of codewords in its basis and the number of rows in its generating matrix), m denotes the size of the circulant matrix, $k_0$ is an integer that is based on the values of n, m and $n_0$, $I_{n-k}$ represents an $(n-k) \times (n-k)$ identity matrix, and each $C_{i,j}'$ is a m×m circulant matrix (with size circulantSize or circSize) of the following form:

$$C'_{i,j} = \begin{bmatrix} c_0 & c_1 & c_2 & \cdots & c_{m-1} \\ c_{m-1} & c_0 & c_1 & \cdots & c_{m-2} \\ c_{m-1} & c_{m-1} & c_0 & \cdots & c_{m-3} \\ \vdots & \vdots & \vdots & & \vdots \\ c_1 & c_2 & c_3 & \cdots & c_0 \end{bmatrix}.$$

In contrast to a quasi-cyclic code in which all columns have an equal column weight (e.g., each column has the same number of 1's), an irregular quasi-cyclic code has at least two columns with different numbers of 1's, i.e., columns with different weights.

Both regular and irregular LDPC codes can be represented using a Tanner graph, which includes a set of nodes (or vertices) and a set of edges connecting the nodes. The Tanner graph corresponding to an M×N parity-check matrix contains M variable nodes (or bit nodes) and N check nodes (or check sum nodes), and provides a graphical representation of the parity-check matrix to which is corresponds. The performance and decoding of an LDPC code (regular or irregular) are based on the row-weights and column-weights of the parity-check matrix and the cycles in the Tanner graph representation.

Figure 7:
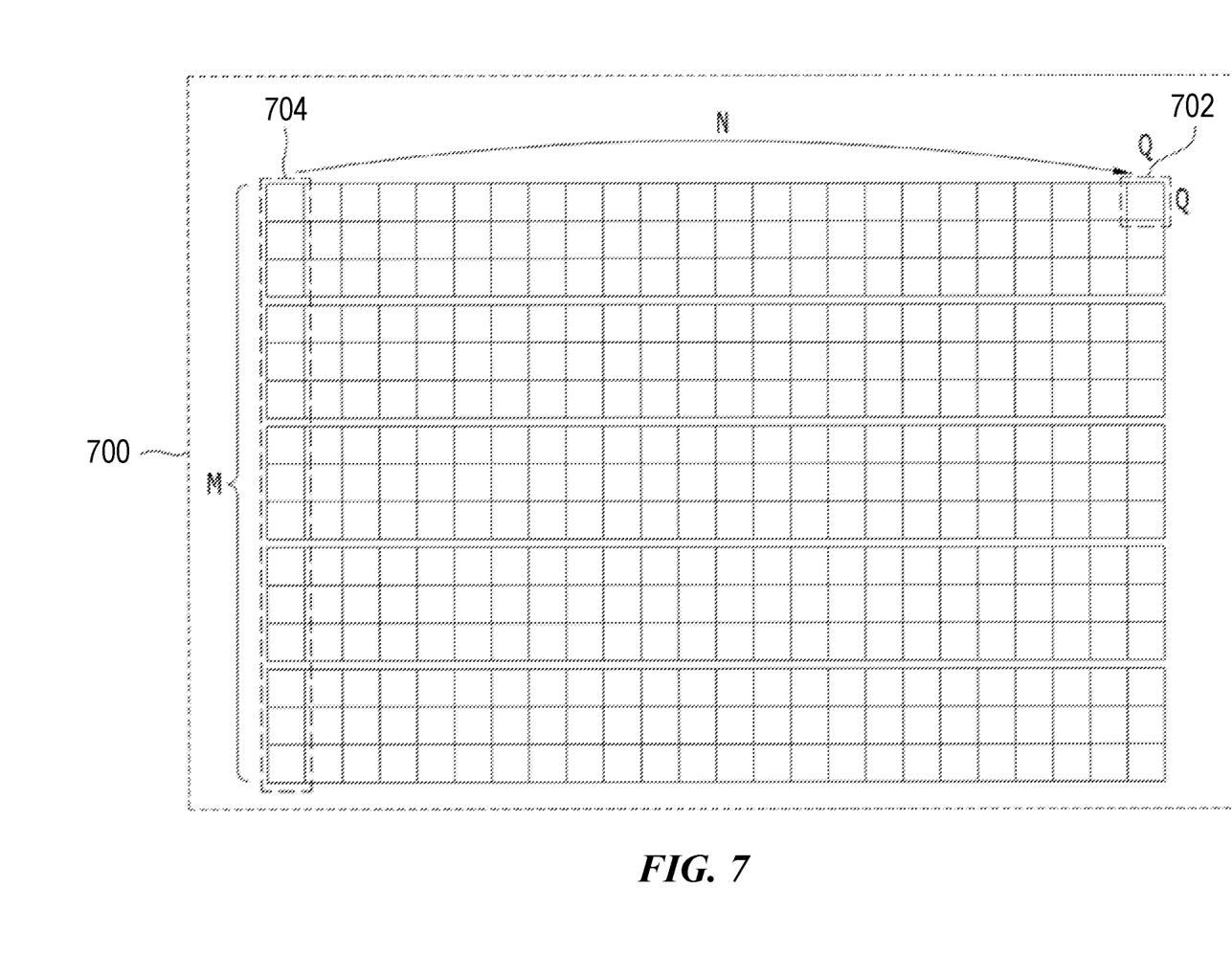
FIG. 7 illustrates an example of a parity-check matrix and a vertically shuffled scheduling (VSS) scheme.

FIG. 7 illustrates an example of a parity-check matrix and a vertically shuffled scheduling (VSS) scheme. As illustrated therein, the parity check matrix 700 may include M×N sub-matrices 702, wherein each of the sub-matrices 702 may be a zero matrix or a cyclically shifted identity matrix of size Q×Q. Each entry of the parity check matrix 700 defining a binary LDPC code is either 0 or 1.

As discussed above, the structure of the LDPC code may be defined by a Tanner graph formed of check nodes, variable nodes, and edges connecting the check nodes and the variable nodes. The check nodes and the variable nodes forming the Tanner graph may correspond to the rows and columns of the parity check matrix 700, respectively. Therefore, the number of the rows of the parity check matrix 700 and the number of the columns of the parity check matrix 700 may correspond to the number of the check nodes and the number of the variable nodes that form the Tanner graph, respectively. When the entry of the parity check matrix 700 is 1, the check node and the variable node which correspond to the row and the column where the entry is positioned may be connected by an edge on the Tanner graph.

In some embodiments, an LDPC decoding operation is performed according to the bit flipping algorithm in a vertically shuffled scheduling (VSS) scheme. According to the VSS scheme, sub-matrices 704 that share the same layer (or layer index) among a plurality of sub-matrices 702 forming the parity check matrix 700 are selected, and a variable node selecting operation is performed that includes selecting variable nodes that correspond to the columns forming the selected sub-matrices. Variable node messages from the selected variable nodes are provided to the check nodes connected to the selected variable nodes. A check node updating operation is performed based on the provided variable node messages for the check nodes provided with the variable node messages. The check nodes performing the check node updating operation provides the check node message to the variable nodes connected to the check nodes. A variable node updating operation on the variable nodes provided with the check node messages is performed based on the provided check node messages. The LDPC decoding operation in the vertically shuffled scheduling method is performed by repeatedly performing the variable node selecting operation, the check node updating operation, and the variable node updating operation, until the LDPC decoding operation is performed successfully.

In some embodiments, the VSS scheme processes the variable nodes one by one in each iteration, i.e., for each variable node, the check nodes that are connected to that variable nodes are processed before the next variable node is processed. This is different from the more traditional parallel or flooding scheme, which processes all the variable nodes and then all the parity nodes in each iteration. The VSS scheme typically results in better convergence in an iterative receiver for LDPC codes.

As discussed above in the context of FIG. 7, bit-flipping decoding may be performed based on the vertical scheduling for faster convergence. In such bit-flipping decoders, the decoder may process a fixed number W of variable nodes (VN) in one clock-cycle, i.e., for each of the W VNs to be processed in a cycle, the decoder counts the number of neighboring check nodes (CN) that are unsatisfied and compares this number with a threshold T. If the count is larger than the threshold T, the decoder flips the current bit-value of the VN. The variable nodes are processed one-by-one from the first variable node to the last variable node. In typical VSS implementations, a bit-flipping decoder processes the W variable nodes (which are also referred to as circulant-columns) in order of their index (e.g., in increasing order of their index).

According to some embodiments of the disclosed technology, the bit-flipping decoder can be configured to process the W variable nodes in an out-of-order manner, i.e., the variable node with index i is not necessarily processed after the variable node with index i−1. Thus, the bit-flipping decoder selects a variable node (or circulant-column) to process after the variable node with index i based on maximizing a predetermined metric. This advantageously results in the bit-flipping decoder converging faster than the conventional in-order bit-flipping decoder, thereby improving decoder throughput and latency of the decoding operation. Furthermore, the correction performance does not degrade when the out-of-order processing is combined with on-the-fly error detection and termination (OEDT), which is described, for example, in U.S. Pat. No. 10,484,008, which is incorporated by reference in its entirety into this patent document. As described therein, the OEDT scheme can be configured to calculate the CRC parity bits on-the-fly, such that for each iteration of the LDPC decoding, the CRC parity can be calculated concurrently based on the hard decision of each iteration.

In some embodiments, the predetermined metric that is maximized is a function of the flipping energies of a circulant-column. In an example, the metric may be the average value of all the bits in a circulant-column (e.g., the circulant-column with the highest average value of all the bits is processed before other columns). In another example, the circulant-column with the maximum flipping energy is selected. In yet another example, another statistic (e.g., the median flipping energy) of the flipping energies of the circulant-columns is used as the metric. In yet another example, the circulant-column that is selected may be based on the iteration index and/or the current syndrome weight.

In some embodiments, the circulant-column that is selected in one iteration may be reselected in the same iteration after a fixed number of steps. That is, selecting the circulant-columns for out-of-order processing is performed with replacement. In other embodiments, the selection is performed without replacement.

Embodiments of the disclosed technology improve the convergence of bit-flipping decoders with minimal additional hardware complexity. In contrast to significantly increasing the hardware to process more than W circulant-columns in one cycle to improve convergence, minimal additional complexity to determine an order of the circulant-columns is used to improve the convergence of the bit-flipping decoder.

According to some embodiments of the disclosed technology, a method for improving the convergence of a bit-flipping decoder in a non-volatile memory using out-of-order processing includes the following operations:

Step 1: Compute the parity-check equations; if all the parity constraints are satisfied, then stop decoding. Otherwise, proceed to Step 2.

Step 2 (illustrated in FIG. 8): Perform bit-flipping decoding based on vertically shuffled scheduling (VSS). Process the i-th circulant-column at the m-th iteration (810), calculate the metric for each unprocessed circulant-column (815) and select the circulant-column that maximizes the metric (820). For the W variable nodes in the selected circulant-column, find the number of unsatisfied parity-check equations, and compute the flipping energy (825). If the flipping energy is larger than a first predetermined threshold T, flip the bit value; otherwise, keep the current bit value (825).

Figure 8:
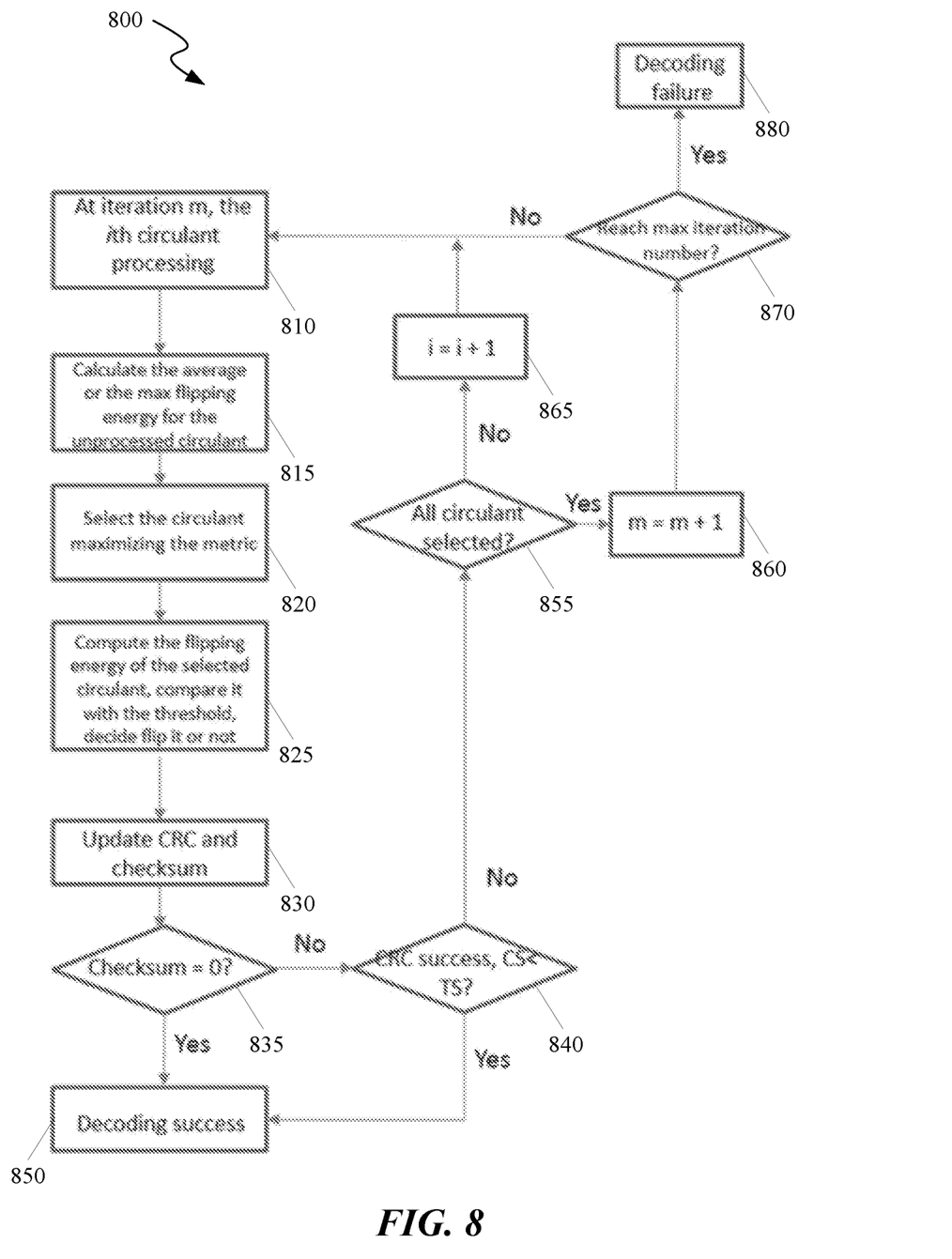
FIG. 8 illustrates a flowchart of an example method for improving the convergence of a bit-flipping decoder in a non-volatile memory using out-of-order processing.

Step 3: Compute the LDPC checksum (or more specifically, the irregular QC-LDPC checksum), and if OEDT is used, compute the CRC parity bits at the end of the decoding iteration (830) and check whether the LDPC checksum is zero (835). If the checksum is zero, declare a decoding success (850). If the checksum is not zero, check whether the CRC matches with the CRC bits in the user bits and whether the LDPC checksum (or syndrome weight) is less than a second predetermined threshold Ts (840). If the CRC has passed and the LDPC syndrome weight is less than the second predetermined threshold, output the current decision as the decoder output (850). Otherwise, continue with decoding by checking whether all the circulant-columns have been selected (855). If they have not, increment the circulant-column index (865) and return to processing the i-th circulant-column at the m-th iteration (810). On the other hand, if all the circulant-columns have been selected, increment the iteration index (860).

Step 4: Repeat Step 2 and Step 3 until the LDPC checksum is zero (835), the CRC is satisfied and the LDPC checksum is less than Ts (840), or until a predefined maximum number of iterations has been reached (870). A decoding failure is declared (880) if the maximum number of iterations has been reached, and neither the LDPC checksum is zero nor the CRC is satisfied and the LDPC checksum is less than Ts.

Figure 9:
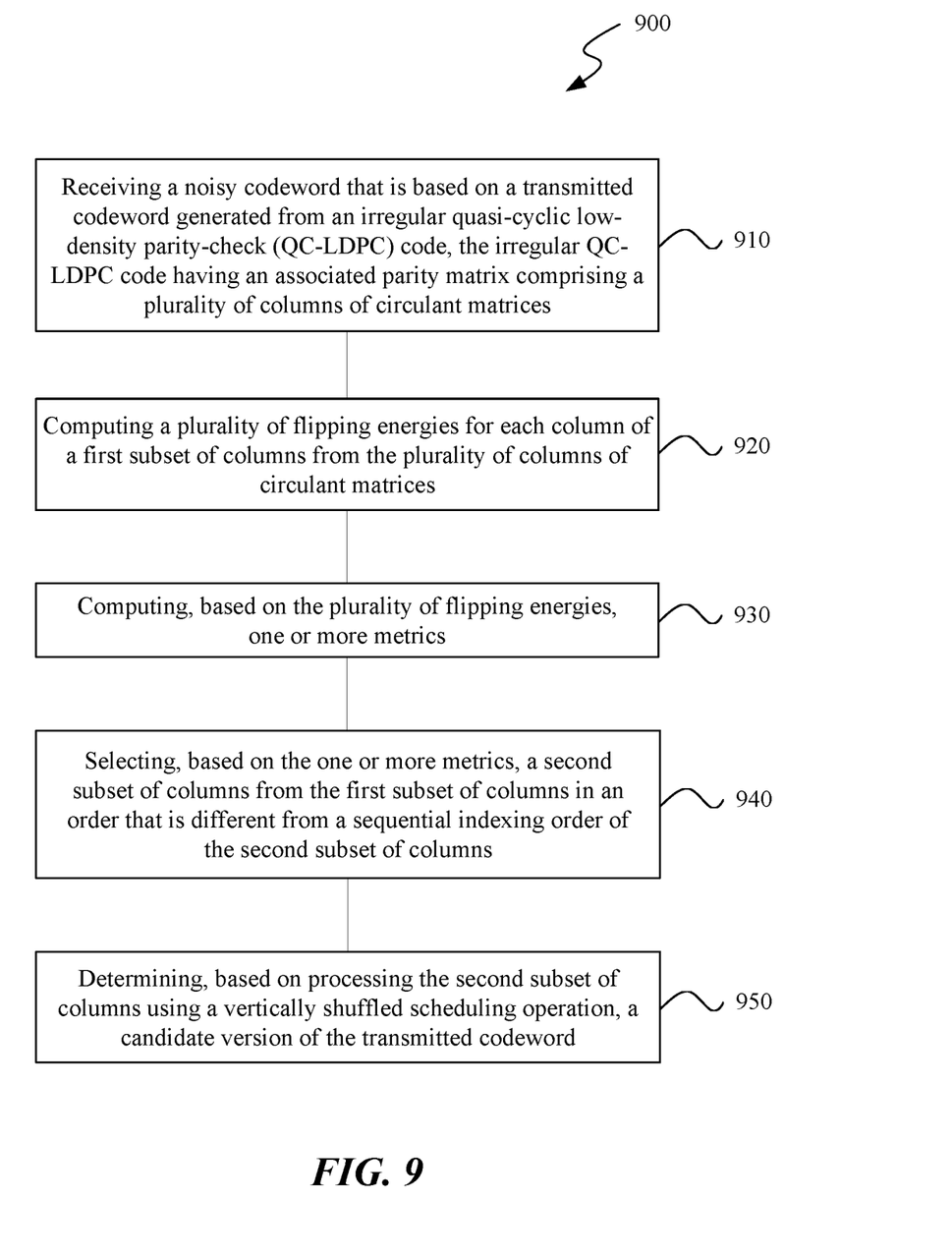
FIG. 9 illustrates a flowchart of another example method for improving the convergence of a bit-flipping decoder in a non-volatile memory using out-of-order processing.

FIG. 9 illustrates a flowchart of another method for improving the convergence of a bit-flipping decoder in a non-volatile memory using out-of-order processing. The method 900 includes, at operation 910, receiving a noisy codeword that is based on a transmitted codeword generated from an irregular QC-LDPC code, the irregular QC-LDPC code having an associated parity matrix comprising a plurality of columns of circulant matrices.

The method 900 includes, at operation 920, computing a plurality of flipping energies for each column of a first subset of columns from the plurality of columns of circulant matrices.

The method 900 includes, at operation 930, computing, based on the plurality of flipping energies, one or more metrics.

The method 900 includes, at operation 940, selecting, based on the one or more metrics, a second subset of columns from the first subset of columns in an order that is different from a sequential indexing order of the second subset of columns.

The method 900 includes, at operation 950, determining, based on processing the second subset of columns using a vertically shuffled scheduling operation, a candidate version of the transmitted codeword. In some embodiments, the processing comprises performing a message passing algorithm between a plurality of variable nodes and a plurality of check nodes that represent the parity matrix of the irregular QC-LDPC code, and the VSS operation processes each of the variable nodes one by one in each iteration of the message passing algorithm.

In some embodiments, computing the one or more metrics comprises computing a metric based on an average of the plurality of flipping energies or a maximum of the plurality of flipping energies.

In some embodiments, computing the one or more metrics is further based on an iteration index or a current syndrome weight associated with the candidate version of the transmitted codeword.

In some embodiments, the method 900 further includes the operation of performing a subsequent iteration of the bit-flipping decoder upon a determination that a checksum for the candidate transmitted codeword is not equal to zero.

In some embodiments, the method 900 further includes the operation of refraining from performing a subsequent iteration of the bit-flipping decoder upon a determination that a checksum for the candidate transmitted codeword is equal to zero or a maximum number of iterations has been performed.

In some embodiments, the selecting the second subset of columns is performed with replacement, and wherein at least one of the second subset of columns is processed twice using the VSS operation.

In some embodiments, the bit-flipping decoder implements an on-the-fly error detection and termination (OEDT) algorithm that generates one or more cyclic redundancy check (CRC) parity bits at an end of each iteration of the bit-flipping decoder.

In some embodiments, the method 900 further includes the operation of refraining from performing a subsequent iteration of the bit-flipping decoder upon a determination that the one or more CRC parity bits matches a plurality of CRC parity bits included in the candidate version of the transmitted codeword.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving convergence of a bit-flipping decoder in a non-volatile memory, comprising:
receiving a noisy codeword that is based on a transmitted codeword generated from an irregular quasi-cyclic low-density parity-check (QC-LDPC) code, the irregular QC-LDPC code having an associated parity matrix comprising a plurality of columns of circulant matrices;
computing a plurality of flipping energies for each column of a first subset of columns from the plurality of columns of circulant matrices;
computing, based on the plurality of flipping energies, one or more metrics;
selecting, based on the one or more metrics, a second subset of columns from the first subset of columns in an order that is different from a sequential indexing order of the second subset of columns; and
determining, based on processing the second subset of columns using a vertically shuffled scheduling (VSS) operation, a candidate version of the transmitted codeword,
wherein the processing comprises performing a message passing algorithm between a plurality of variable nodes and a plurality of check nodes that represent the parity matrix of the irregular QC-LDPC code, and
wherein the VSS operation processes each of the variable nodes one by one in each iteration of the message passing algorithm.

2. The method of claim 1, wherein computing the one or more metrics comprises computing a metric based on an average of the plurality of flipping energies or a maximum of the plurality of flipping energies.

3. The method of claim 2, wherein computing the one or more metrics is further based on an iteration index or a current syndrome weight associated with the candidate version of the transmitted codeword.

4. The method of claim 1, further comprising:
performing a subsequent iteration of the bit-flipping decoder upon a determination that a checksum for the candidate transmitted codeword is not equal to zero.

5. The method of claim 1, further comprising:
refraining from performing a subsequent iteration of the bit-flipping decoder upon a determination that a checksum for the candidate transmitted codeword is equal to zero or a maximum number of iterations has been performed.

6. The method of claim 1, wherein the selecting the second subset of columns is performed with replacement, and wherein at least one of the second subset of columns is processed twice using the VSS operation.

7. The method of claim 1, wherein the bit-flipping decoder implements an on-the-fly error detection and termination (OEDT) algorithm that generates one or more cyclic redundancy check (CRC) parity bits at an end of each iteration of the bit-flipping decoder.

8. The method of claim 7, further comprising:
refraining from performing a subsequent iteration of the bit-flipping decoder upon a determination that the one or more CRC parity bits matches a plurality of CRC parity bits included in the candidate version of the transmitted codeword.

9. A system for improving convergence of a bit-flipping decoder in a non-volatile memory, comprising:
a processor and a memory including instructions stored thereupon, wherein the instructions upon execution by the processor cause the processor to:
receive a noisy codeword that is based on a transmitted codeword generated from an irregular quasi-cyclic low-density parity-check (QC-LDPC) code, the irregular QC-LDPC code having an associated parity matrix comprising a plurality of columns of circulant matrices;

compute a plurality of flipping energies for each column of a first subset of columns from the plurality of columns of circulant matrices;

compute, based on the plurality of flipping energies, one or more metrics;

select, based on the one or more metrics, a second subset of columns from the first subset of columns in an order that is different from a sequential indexing order of the second subset of columns; and determine, based on processing the second subset of columns using a vertically shuffled scheduling (VSS) operation, a candidate version of the transmitted codeword, wherein the processing comprises performing a message passing algorithm between a plurality of variable nodes and a plurality of check nodes that represent the parity matrix of the irregular QC-LDPC code, and wherein the VSS operation processes each of the variable nodes one by one in each iteration of the message passing algorithm.

10. The system of claim 9, wherein computing the one or more metrics comprises computing a metric based on an average of the plurality of flipping energies or a maximum of the plurality of flipping energies.

11. The system of claim 10, wherein computing the one or more metrics is further based on an iteration index or a current syndrome weight associated with the candidate version of the transmitted codeword.

12. The system of claim 9, wherein the processor is further configured to:

perform a subsequent iteration of the bit-flipping decoder upon a determination that a checksum for the candidate transmitted codeword is not equal to zero.

13. The system of claim 9, wherein the processor is further configured to:

refrain from performing a subsequent iteration of the bit-flipping decoder upon a determination that a checksum for the candidate transmitted codeword is equal to zero or a maximum number of iterations has been performed.

14. The system of claim 9, wherein the selecting the second subset of columns is performed with replacement, and wherein at least one of the second subset of columns is processed twice using the VSS operation.

15. A non-transitory computer-readable storage medium having instructions stored thereupon for improving convergence of a bit-flipping decoder in a non-volatile memory, comprising:

instructions for receiving a noisy codeword that is based on a transmitted codeword generated from an irregular quasi-cyclic low-density parity-check (QC-LDPC) code, the irregular QC-LDPC code having an associated parity matrix comprising a plurality of columns of circulant matrices;

instructions for computing a plurality of flipping energies for each column of a first subset of columns from the plurality of columns of circulant matrices;

instructions for computing, based on the plurality of flipping energies, one or more metrics;

instructions for selecting, based on the one or more metrics, a second subset of columns from the first subset of columns in an order that is different from a sequential indexing order of the second subset of columns; and instructions for determining, based on processing the second subset of columns using a vertically shuffled scheduling (VSS) operation, a candidate version of the transmitted codeword, wherein the processing comprises performing a message passing algorithm between a plurality of variable nodes and a plurality of check nodes that represent the parity matrix of the irregular QC-LDPC code, and wherein the VSS operation processes each of the variable nodes one by one in each iteration of the message passing algorithm.

16. The storage medium of claim 15, wherein computing the one or more metrics comprises computing a metric based on an average of the plurality of flipping energies or a maximum of the plurality of flipping energies.

17. The storage medium of claim 16, wherein computing the one or more metrics is further based on an iteration index or a current syndrome weight associated with the candidate version of the transmitted codeword.

18. The storage medium of claim 15, wherein the selecting the second subset of columns is performed with replacement, and wherein at least one of the second subset of columns is processed twice using the VSS operation.

19. The method of claim 15, wherein the bit-flipping decoder implements an on-the-fly error detection and termination (OEDT) algorithm that generates one or more cyclic redundancy check (CRC) parity bits at an end of each iteration of the bit-flipping decoder.

20. The storage medium of claim 19, further comprising:

instructions for refraining from performing a subsequent iteration of the bit-flipping decoder upon a determination that the one or more CRC parity bits matches a plurality of CRC parity bits included in the candidate version of the transmitted codeword.

* * * * *